US006627463B1

(12) United States Patent
Sarfaty

(10) Patent No.: US 6,627,463 B1
(45) Date of Patent: Sep. 30, 2003

(54) SITU MEASUREMENT OF FILM NITRIDATION USING OPTICAL EMISSION SPECTROSCOPY

(75) Inventor: Moshe Sarfaty, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 306 days.

(21) Appl. No.: 09/693,582

(22) Filed: Oct. 19, 2000

(51) Int. Cl.[7] ............................................... H01L 21/00
(52) U.S. Cl. .............................................. 438/7; 438/14
(58) Field of Search ........................... 438/14–16, 240, 438/448, 714

(56) References Cited

U.S. PATENT DOCUMENTS

| 5,694,207 | A | * | 12/1997 | Hung et al. ..................... 356/72 |
| 5,877,090 | A | * | 3/1999 | Padmapani et al. .......... 438/714 |
| 6,340,603 | B1 | * | 1/2002 | Bell ................................ 438/9 |
| 6,372,151 | B1 | * | 4/2002 | Shin et al. ..................... 216/67 |
| 6,444,542 | B2 | * | 9/2002 | Moise et al. ................. 438/448 |
| 6,451,647 | B1 | * | 9/2002 | Yang et al. .................. 438/240 |
| 6,455,160 | B1 | * | 9/2002 | Hiraoka et al. ............. 428/408 |
| 6,471,833 | B2 | * | 10/2002 | Kumar et al. .......... 204/192.37 |
| 6,492,222 | B1 | * | 12/2002 | Xing ........................... 438/240 |
| 6,499,492 | B1 | * | 12/2002 | Cho et al. .................... 134/1.1 |

OTHER PUBLICATIONS

U.S. patent application Ser. No. 09/348,972, Balasubramhanya et al., filed Jul. 7, 1999.
K.P. Killeen et al., "In Situ Spectral Reflectance Monitoring of III–V Epitaxy," *Journal of Electronic Materials*, vol. 23, No. 2, pp. 179–183 (1994).
R. Laaksonen, "Full Wafer Interferometric Measurements of Etch Rate and Thickness Uniformity," *Semiconductor International*, pp. 277–286 (Jul. 1997).
I. Tepermeister et al., "In Situ Monitoring of Product Wafers," *Solid State Technology*, pp. 63–67 (Mar. 1996).
K. Wong et al., "Endpoint Prediction for Polysilicon Plasma Etch Via Optical Emission Interometry," *J. Vac. Sci. Technol. A*, vol. 15, No. 3, pp. 1403–1408 (May/Jun. 1997).
B. Manly, "Principal Components Analysis," *Multivariate Statistical Methods, A Primer, Second Edition, Chapman & Hall*, Chapter 6, pp. 76–92. (1986, 1994).
H. Nimi et al., "Monolayer–Level Controlled Incorporation of Nitrogen at Si–SiO$_2$ Interfaces Using Remote Plasma Processing," *J. Vac. Sci. Technol. A*, vol. 17, No. 6, pp. 3185–3196 (Nov./Dec. 1999).
H. Nimi et al., "Monolayer–Level Controlled Incorporation of Nitrogen in Ultrathin Gate Dielectrics Using Remote Plasma Processing: Formation of Stacked "N–O–N" Gate Dielectrics," *J. Vac. Sci. Technol. B*, vol. 17, No. 6 pp. 2610–2621 (Nov./Dec. 1999).
S.V. Hattangady et al., "Controlled Nitrogen Incorporation at the Gate Oxide Surface," *Appl. Phys. Lett.*, vol. 66, No. 25, pp. 3495–3497 (Jun. 1995).
S.V Hattangady et al., "Remote Plasma Nitrided Oxides for Ultrathin Gate Dielectric Applications," *SPIE Conference on Microelectronic Device Technology II, Santa Clara, CA, Sep. 1998*, vol. 35–6, pp. 30–39 (Sep. 1998).

* cited by examiner

Primary Examiner—John F. Niebling
Assistant Examiner—Olivia Luk
(74) Attorney, Agent, or Firm—Townsend & Townsend & Crewe LLP.

(57) ABSTRACT

A method of nitriding a silicon oxide film according to the present invention includes flowing a nitrogen-containing gas into a substrate processing chamber and forming a plasma from the gas. Optical emissions from the plasma are then measured while a silicon oxide film deposited over a substrate disposed in the chamber is exposed to the plasma to obtain OES data that is used to optimize, monitor and/or stop the nitriding process.

15 Claims, 9 Drawing Sheets

SITU MEASUREMENT OF FILM NITRIDATION USING OPTICAL EMISSION SPECTROSCOPY

BACKGROUND OF THE INVENTION

The present invention provides techniques that are useful in the manufacture of integrated circuits among other technologies. Embodiments of the present invention relate to optimizing and monitoring the performance of a silicon oxide nitridation process and providing endpoint detection for such a process.

Advances in integrated circuit technology have led to a continuing decrease in minimum feature sizes. This scaling down of integrated circuits has resulted in the use of ultra-thin gate oxide films less than 40 Å thick. At such a thickness, some semiconductor manufacturers have used a film nitridation process in order to improve, among other reasons, the gate oxide film's resistance to boron penetration, increase the $V_{BD}$ (breakdown voltage) and $Q_{BD}$ (breakdown current) of the transistor and improve the device's resistance to radiation damage. A variety of film nitridation processes are known including thermal anneal processes, ion implantation processes and plasma, both remote and in situ, nitridation processes.

The rate and degree of nitridation in the above processes depends on many variables including temperature, plasma power (where applicable), gas flow rates and chamber pressure among others. Regardless of the type of nitridation process used, it is important to accurately control the depth of the nitridation process as well as the degree of nitridation. In the past, known nitridation processes have used timed endpoint techniques. These timed endpoint techniques have provided adequate nitridation control for some applications but improved techniques are desirable.

Optical emission spectroscopy (OES) is a commonly used technique to capture the dynamics of a plasma-assisted process. Optical emission results from excess energy released in the form of photons from excited species that decay to a lower energy level state. OES has been primarily used in the semiconductor industry to determine endpoint during etch processes, to monitor process chemistry and for plasma diagnostic purposes.

SUMMARY OF THE INVENTION

Embodiments of the present invention provide improved techniques to control a film nitridation process. The inventor discovered that the oxide nitridation process modifies properties of the nitrided film in a manner that causes OES variations when using an in situ nitridation plasma. Embodiments of the present invention measure optical emissions during the in situ plasma nitridation process and use the measured emissions to control the nitridation process including optimizing, monitoring and/or endpointing the nitridation process.

In one embodiment, the method of nitriding a silicon oxide ($SiO_x$) film according to the present invention includes flowing a nitrogen-containing gas into a substrate processing chamber and forming a plasma from the gas. Optical emissions from the plasma are then measured while a silicon oxide film deposited over a substrate disposed in the chamber is exposed to the plasma to obtain OES data that is used to optimize, monitor and/or stop the nitriding process.

In another embodiment the OES data is compared to OES data taken from a previous substrate processing operation to determine when to stop the nitriding process. The comparison can be made using a subtraction or other type of differential calculation, a band ratio, principal component or other pattern recognition techniques or statistical techniques among others.

These and other embodiments of the present invention, as well as its advantages and features are described in more detail in conjunction with the text below and attached figures.

DESCRIPTION OF THE SPECIFIC EMBODIMENTS

I. An Exemplary Plasma System Configured to Practice the Present Invention

The method of the present invention can be used with standard in situ plasma substrate processing chambers in which a spectrometer or other type of radiation collector can be either placed within the chamber to measure radiation emitted by the plasma or that includes a window or viewport through which such radiation can be directed to a spectrometer positioned outside the chamber.

Figure 1:
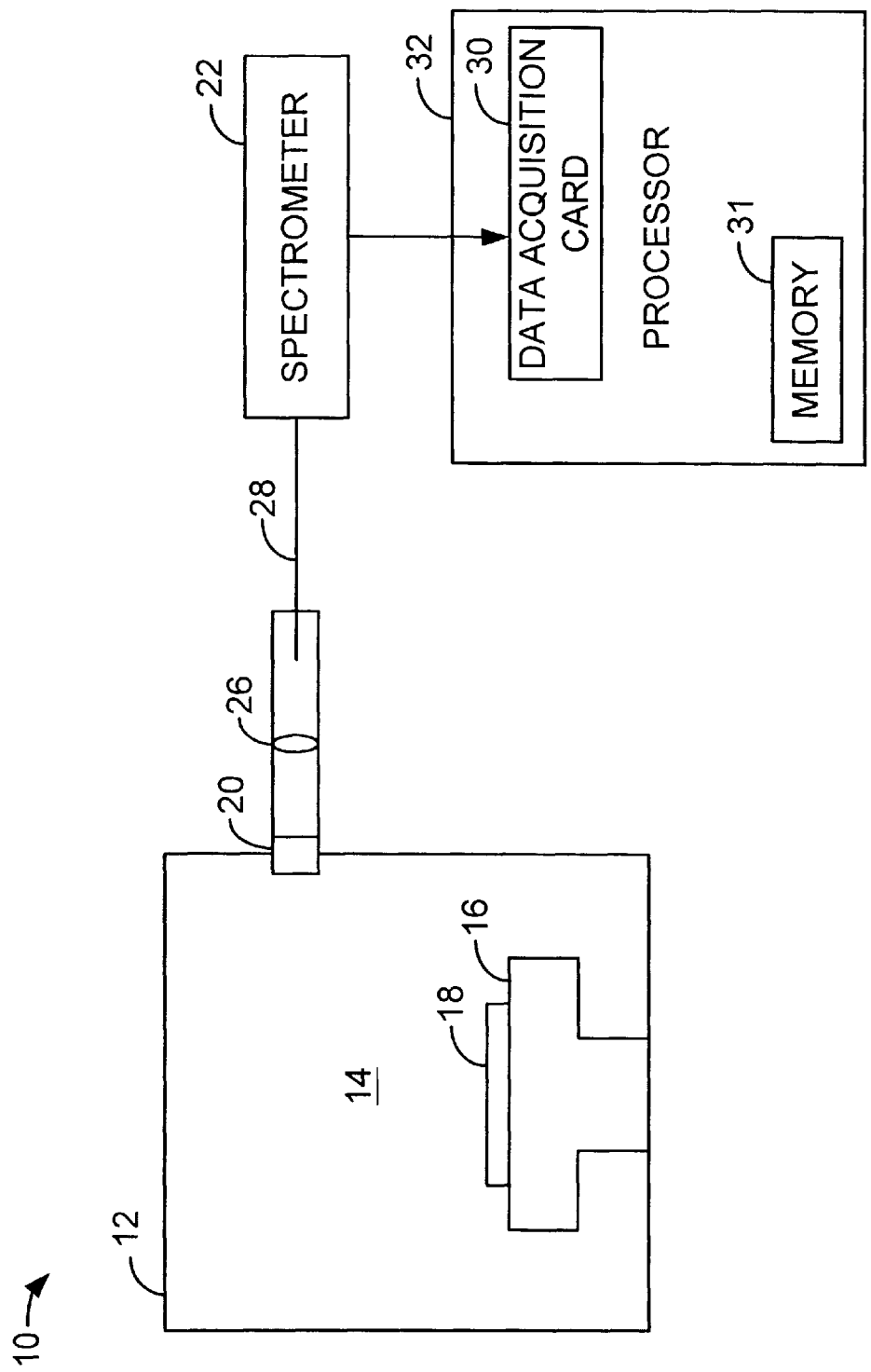
FIG. 1 is a simplified cross-sectional view of an exemplary plasma substrate processing chamber configured to practice the method of the present invention.

The patent application file contains at least one drawing executed in color. Copies of this patent application publication with color drawings will be provided by the Office upon request and payment of the necessary fee. FIG. 1 is a simplified cross-sectional view of an exemplary plasma chamber 10 configured to practice the method of the present invention. As shown in FIG. 1, plasma chamber 10 includes a housing 12 that surrounds a substrate processing region 14. During a plasma process a substrate 18 is supported on a pedestal 16 and exposed to a plasma formed in region 14. The plasma generates electromagnetic radiation that includes emissions having wavelengths in the optical spectrum (i.e., from about 180 to 1100 nm). A portion of these emissions can be detected through a window 20 and by a spectrometer 22 or other suitable device such as a monochromator of a spectral filter equipped with one or more photodiodes. A fiber optic cable 28 is the vehicle through which the radiation travels from window 20 to reach spectrometer 22. An optional lens 26 collimates the radiation that passes through window 20 into a fiber optic cable 28.

Spectrometer 22 spectrally separates radiation based on wavelength (e.g., via a prism or diffraction grating (not shown)), and generates detection signals (e.g., detection currents) for a plurality of the spatially separated wavelengths. A data acquisition card 30 coupled to a processor 32 collects data representing the separated wavelengths at a periodic sampling rate. In one embodiment processor 32 also controls the operation of chamber 10 through various control lines (not shown) by executing computer instructions stored in a memory 31 coupled to the processor.

In a current embodiment, spectrometer 22 spatially separates the radiation wavelengths onto a 2048 linear silicon charge-coupled device (CCD) array. The CCD array generates 2048 detection currents or 2048 "channels" of detection signal information (i.e., optical emission spectroscopy (OES) information) for radiation wavelengths from about 180–870 nanometers. In this embodiment, data acquisition card 30 has a 1 MHz sample rate and converts the analog sampled signals into 12-bit digital data.

II. OES Measurement Changes Seen During an Oxide Nitridation Process

Experiments performed by the inventor indicate that OES data measured from the plasma optical emission during a silicon oxide nitridation process performed in a plasma processing chamber, such as the exemplary chamber described above, changes with time. As previously described, it was known that OES data taken from a plasma emission during plasma etch changed over time. But such a process involves a change in the thickness of a layer. That is, during a plasma etch process the thickness of the layer being etched decreases with time.

Assuming process conditions such as RF power level, gas flow, temperature, pressure, etc. remain constant for a given plasma, it was not previously known that OES data from the plasma emission would change over time if the thickness of the layer remained substantially constant while the layer was subjected to the plasma. The inventor found, however, that when a silicon oxide layer is subjected to a plasma nitridation process that is indeed the case. This is particularly interesting since the inventor also subjected a bare silicon wafer to a plasma nitridation process and found that OES data measured from the plasma emission in this process did not change with time. Thus, the inventor has discovered that OES data from a plasma emission during the nitridation of silicon oxide changes based on the changing material in the oxide layer while OES data from a plasma emission during nitridation of bare silicon does not change based on the changing material of the silicon.

Details of these experiments and others are set forth below. Unless otherwise noted, all the experiments discussed below were performed in a DPS-Poly chamber manufactured by Applied Materials, the assignee of the present invention, and used source RF power to form a plasma from molecular nitrogen ($N_2$) without applying bias RF power to the wafer or wafer support.

Figure 2A:
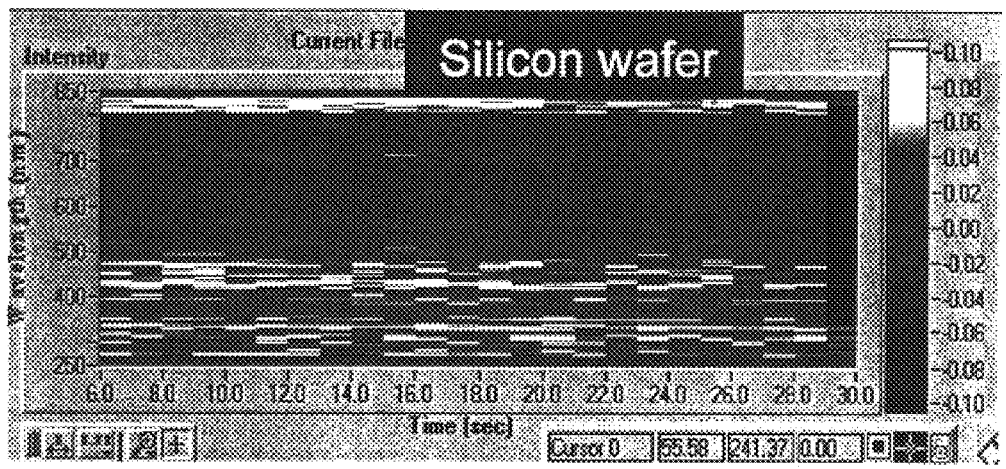
FIG. 2A shows the time-dependent optical emission spectra for a plasma nitridation process performed on a bare silicon wafer.

FIG. 2A shows the time-dependent optical emission spectra for a plasma nitridation process performed on a bare silicon wafer. The x-axis in FIG. 2A represents the time at which the spectral data was collected, the y-axis represents the wavelengths of the collected plasma emissions and the color-scale represents the changes in the intensity of the emission relative to its time average intensity. Data for the color scale was calculated by converting the analog output of the CCD array in spectrometer 22 into a 12-bit digital signal. The time average intensity of the signal for each wavelength was then determined and colors assigned to represent measured values relative to the time averaged intensity, i.e., the variation from mean. The nitridation process exposed the bare silicon wafer to a plasma from molecular nitrogen ($N_2$). The nitrogen was flowed into the chamber at a rate of 100 sccm and the plasma was formed using source RF power only at a frequency of 13.56 MHz and a power level of 1000 Watts. Pressure within the chamber was set to 20 mTorr.

The calculations and color assignments were all made using Labview™ software distributed by National Instruments. As evident in FIG. 2A, the color assigned to individual wavelengths shows little change along the x-axis. This indicates that the OES intensities of the emissions for the wavelengths shown in the graph remain substantially constant over time during the nitridation process when run on a bare silicon wafer and prove that there is no chemistry change or intensity drift inherent in the process.

Figure 2B:
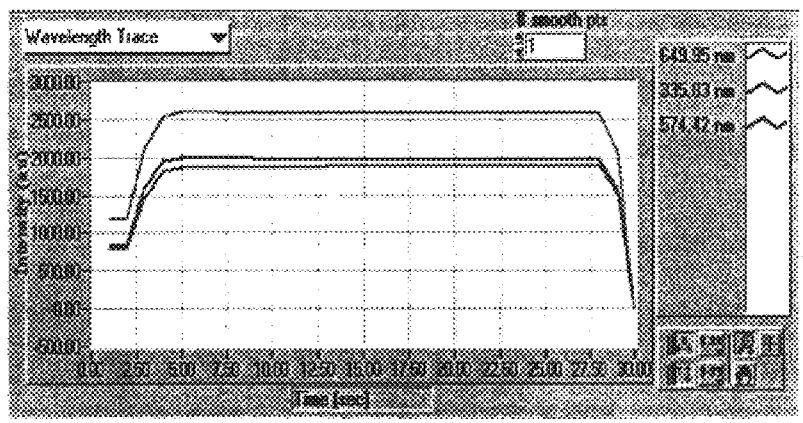
FIG. 2B is a plot showing the intensity of three individual spectra (335.83 nm 574.42 nm and 649.95 nm) over time for the process depicted in FIG. 2A.

Further evidence of stable line intensities of a plasma nitridation process on a bare silicon wafer can be seen in FIG. 2B, which is a plot showing the intensity of three individual spectra (335.83 nm, 574.42 nm and 649.95 nm) over time. As seen in FIG. 2B, after an initial 5 second ignition period during which the plasma is known to be unstable and except for the brief period at the end of the graph during which the plasma is extinguished, the intensity of each spectral line remains substantially constant. In this case, the intensity of each shown spectral line varies by less than 0.4% from the 5 second to 27.5 second marks.

Figure 3A:
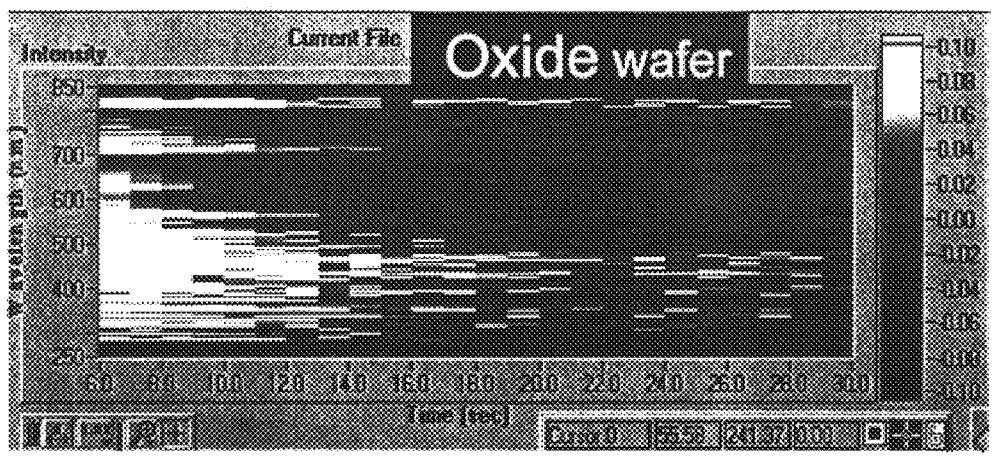
FIG. 3A shows the time-dependent optical emission spectra for a plasma nitridation process performed on a silicon oxide layer deposited over a bare silicon wafer.

In contrast to the data shown in FIGS. 2A and 2B, the inventor has found that certain optical plasma emissions change significantly during a nitridation process of a silicon oxide layer. FIG. 3A shows the time-dependent optical emission spectra for a plasma nitridation process performed on a silicon oxide layer deposited over a bare silicon wafer. As in FIG. 2A, the x-axis represents the time at which the spectral interference data was collected, the y-axis spans the spectral range of collected emissions and the color-scale represents the changes in the intensity of the plasma optical emission relative to its time average intensity. This data was collected during the nitridation of a 50 Å oxide layer. The nitridation process was performed at a pressure of 20 mTorr, a source RF power level (13.56 MHz) of 1500 k Watts, no bias RF signal and an $N_2$ flow rate of 100 sccm. As evident from FIG. 3A, OES data in the spectral range of 280 nm to 800 nm changes during the oxide nitridation process and thus some part of it can be used to monitor and/or control such a process as described in detail further below.

Figure 3B:
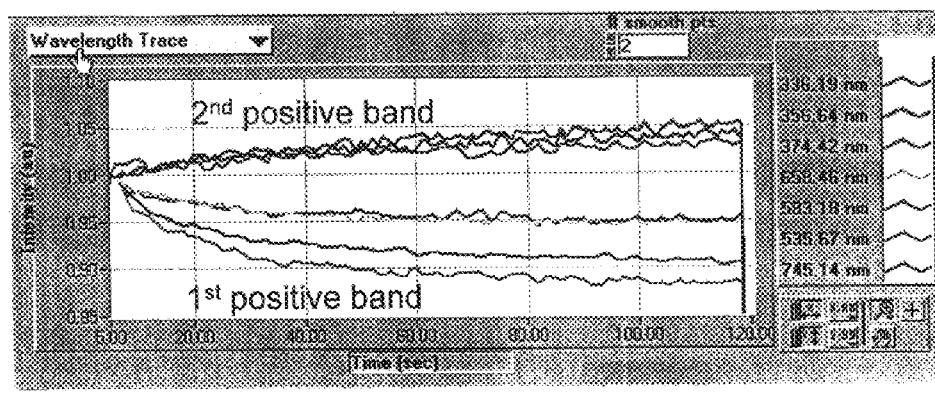
FIG. 3B shows the change in intensity of seven selected emissions (336.19 nm, 356.64 nm, 374.42 nm, 535.67 nm, 583.18 nm, 658.46 nm and 745.14 nm) over time for the process depicted in FIG. 3A.
Figure 4A:
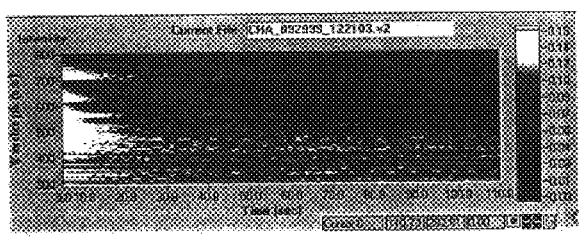
FIG. 4A is a graph showing the time-dependent optical emission spectra for a plasma nitridation process performed on a silicon oxide layer deposited over a silicon wafer.
Figure 4B:
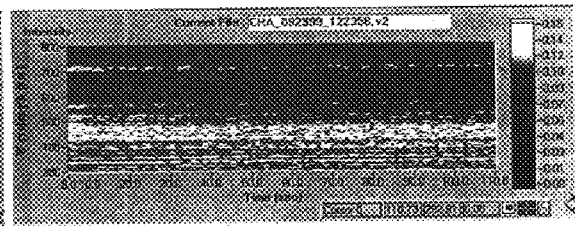
FIG. 4B is a graph showing the time-dependent optical emission spectra for the same plasma nitridation process performed on the already nitrided oxide layer from the experiment of FIG. 4A.

FIG. 3B shows the change in intensity of seven selected emissions (336.19 nm, 356.64 nm, 374.42 nm, 535.67 nm, 583.18 nm, 658.46 nm and 745.14 nm) over time. As evident in the figure, the intensities of lines in a first band (greater than 550 nm) decreases with time while the intensities of lines in a second band (less than 400 nm) increases with time. Also of interest, the inventor has determined that the first band is sensitive to both process and film conditions while the second band is only sensitive to process conditions.

inventor also determined that subjecting an already nitrided silicon oxide film to a nitriding plasma a second time does not produce changing OES data. FIG. 4A is a graph showing the time-dependent optical emission spectra for a plasma nitridation process (20 mTorr, $N_2$ flow of 100 sccm and 1.5 kW of source RF power) performed on a silicon oxide layer deposited over a silicon wafer. FIG. 4B, on the other hand, is a graph showing the time-dependent optical emission spectra for the same plasma nitridation process performed on the already nitrided oxide layer from the experiment of FIG. 4A. As can be seen from these figures, the OES data in FIG. 4A varies greatly over time while the OES data in FIG. 4B is substantially constant and unchanging.

Figure 4C:
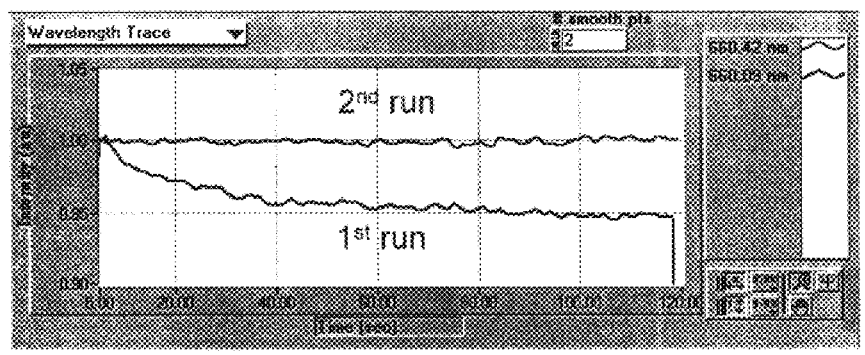
FIG. 4C shows a more direct comparison of the intensity change for a 600 nm emission during the nitridation process of FIG. 4A and the nitridation process of FIG. 4B.

FIG. 4C shows a more direct comparison of the intensity change for one particular emission (660 nm) during the nitridation process of FIG. 4A and the nitridation process of FIG. 4B. As evident in FIG. 4C, the emission varies approximately 5% when the nitridation is performed on a fresh oxide layer and varies less than 0.4% when the previously nitrided oxide layer is subject to a second nitridation step. From this and other data it is clear that the nitridation process modifies film properties of a fresh oxide layer in a manner that causes OES variations.

Figure 5A:
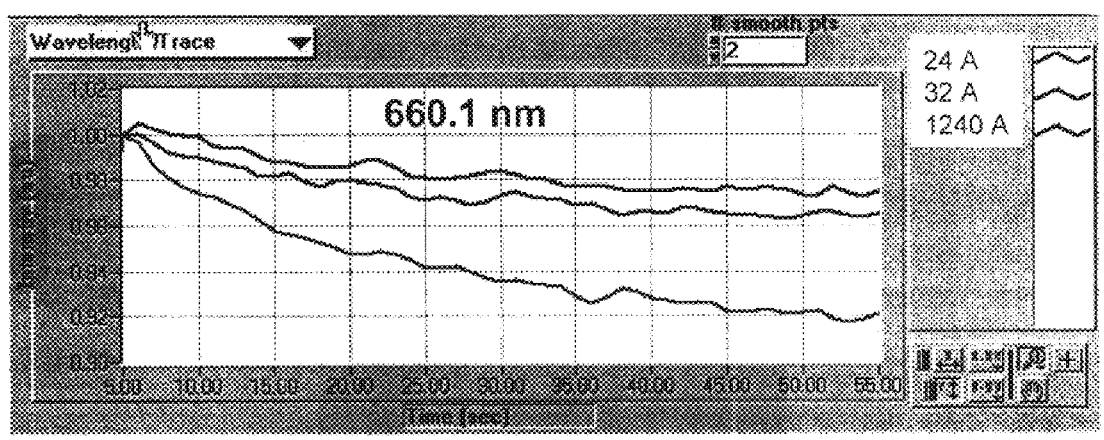
FIG. 5A is a graph showing the change in intensity of a 660 nm emission from the plasma during a plasma oxide nitridation process performed on silicon oxide layer of varying thickness.

The inventor also discovered that changes in the OES data for silicon oxide nitridation processes are sensitive to the thickness of the oxide layer. The thinner the oxide layer is, the larger the relative change in emission intensity. This discovery is particularly useful for monitoring and controlling the nitridation of very thin gate oxides such as oxides having a thickness of 30 Å, 20 Å or even less. For example, as shown in FIG. 5A, the intensity of the 660.1 nm band decreases by 2%, 4% and 8% for 1240 Å, 32 Å and 24 Å thick oxide layers, respectively. The data in FIG. 5A was measured for a 20 mTorr nitridation process that used 2 kW of source RF power, no bias RF power and an $N_2$ flow rate of 100 sccm.

The data in FIG. 5A indicates the thinner the oxide, the faster is the nitridation process and the stronger the effect on the OES temporal behavior for emission wavelengths in the first positive $N_2$ band (greater than 500 nm). The data from FIG. 5A for the 32 Å and 24 Å thick films is reproduced in FIGS. 5B and 5C. Also shown in FIGS. 5B and 5C, and measured from the same nitridation process as FIG. 5A is OES data in the second positive $N_2$ band (less than 500 nm). As can be seen in these figures, emissions in the second positive $N_2$ band do not show the same dependence on thickness as those in the first positive band. Instead, the OES data in this second band is insensitive to oxide thickness.

Figure 6A:
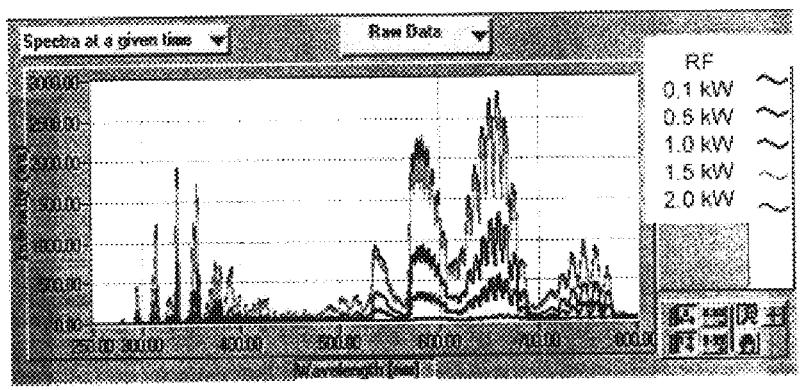
FIGS. 6A and 6B are graphs showing the effect of source RF power on raw and normalized OES data, respectively, for a plasma oxide nitridation process.

The inventor also discovered through additional experiments that both source RF power and pressure have a strong effect on the optical emission spectra. OES data scales non-linearly with both source RF power and pressure. The effect of source RF power on the OES data is shown in FIG. 6A for a 20 mTorr, 100 sccm $N_2$ flow process. The data in FIG. 6A is taken at the 30 second point of a nitridation process that reached saturation (i.e., further nitridation does not increase the amount of nitrogen in the material) at approximately 60 seconds. As evident in FIG. 6A, the emission intensities increase non-linearly with RF power with the scaling being different at different parts of the spectra. RF power effects both plasma density and electron energy distribution function (EEDF).

Intensity of a given species x ($I_x$) varies according to the following formula:

$$I_x n_{gx} n_e K_x(\epsilon_e) \qquad (1)$$

where $n_{gx}$ is the ground state intensity of x, $n_e$ is the electron density, $K_x$ is the electron impact excitation rate and $\epsilon_e$ is the EEDF. Based on this formula, the normalization to total emissions cancels out the election density ($n_e$) effect, which is a global effect on OES intensity. If only density changes, all parts of the OES spectra scale the same.

Figure 6B:
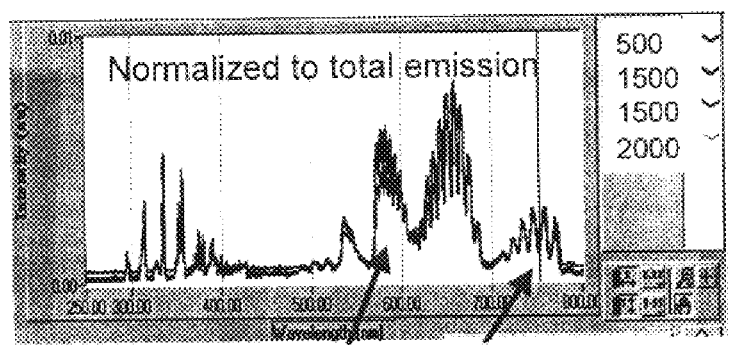

As shown in FIG. 6B, once normalized to total emissions, the OES data greater than 700 nm is insensitive to EEDF variations and can thus be used to monitor the relative density of the plasma. Normalized OES data less than 700 nm, on the other hand, can be used to monitor EEDF.

Figure 6C:
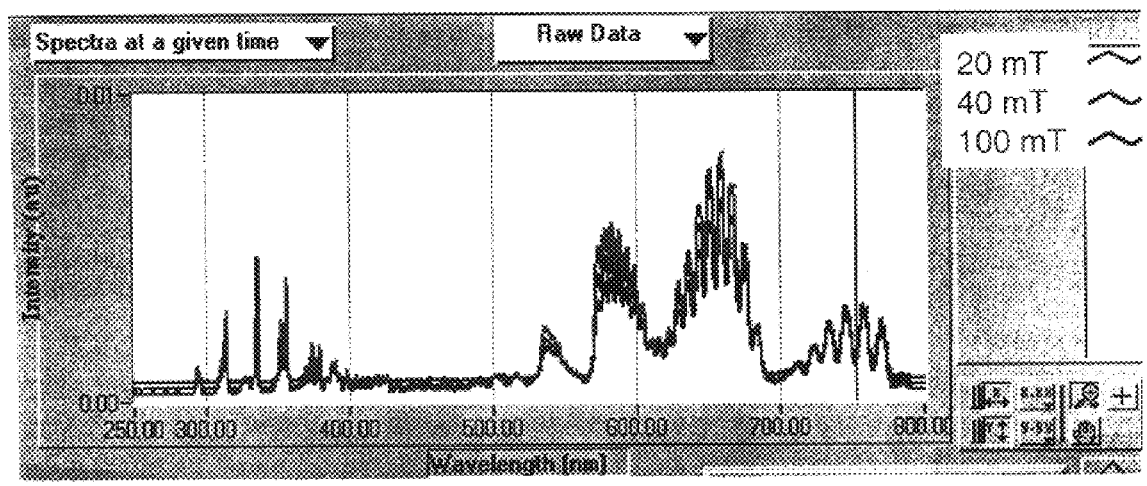
FIGS. 6C is a graph showing the effect of chamber pressure on the OES data for a plasma oxide nitridation process.

Similar effects on OES data were observed when the pressure of the nitridation process was varied from 20–100 mTorr. FIG. 6C is graph showing OES data as a function of three different pressure levels (20, 40 and 100 mTorr) at the 30 second point in a nitridation process (1.0 kW source RF power, 100 sccm $N_2$) that reaches saturation at approximately 60 seconds. As evident from the graph, the OES data is also strongly effected in a non-linear way to pressure changes. When the intensity is normalized to total emission, the lower the pressure the higher is the relative intensity. The spectral bands below 700 nm are very sensitive to these two parameters. The spectral bands above 700 nm are less sensitive to electron temperature variations and may be used to monitor changes in electron density. Normalizing the OES to these bands may separate the effects of electron density variations from electron energy distribution.

In contrast to the variations in OES data seen in response to changes in source RF power level and chamber pressure level, the inventor has determined that $N_2$ flow rate does not induce a change in OES data. Increasing the $N_2$ flow rate can result in a quicker nitridation process but does not produce global OES variations.

III. Controlling an Oxide Nitridation Process According to Embodiments of the Present Invention Based on the discoveries described above, the inventor has developed several different techniques to monitor, control and/or optimize an oxide plasma nitridation process according to the present invention. Two of these techniques are described more fully below. The first technique, used to endpoint a plasma oxide nitridation process, is described with respect to FIGS. 7, 8A and 8B. The second technique, used to detect a fault in an oxide plasma nitridation process, is described with respect to FIG. 9.

Figure 7:
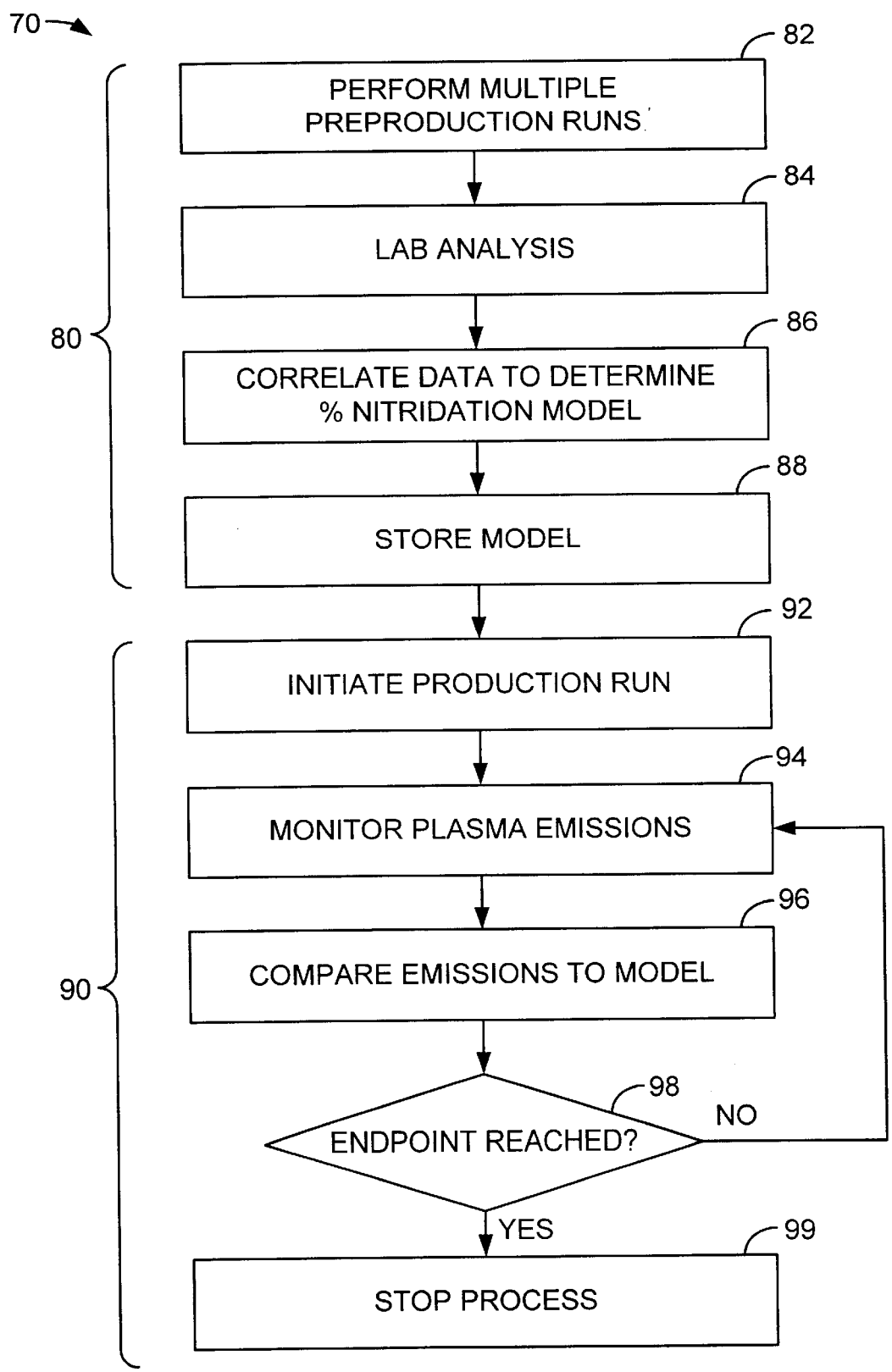
FIG. 7 is a flowchart illustrating one embodiment of the method of the present invention used for endpoint detection of a silicon oxide plasma nitridation process.

FIG. 7 is a flowchart illustrating the steps involved in a method 70 used to determine the endpoint in a plasma oxide nitridation process according to one embodiment of the present invention. As shown in FIG. 7, endpoint detection method 70 starts with performing a calibration process 80. Calibration process 80 includes performing a number of preproduction runs (step 82) of the plasma oxide nitridation process to be endpointed using the techniques of the present invention. The preproduction runs are performed using substantially the same conditions (e.g., same oxide thickness, same source RF power level, same chamber pressure) as the production plasma nitridation process that will be subsequently endpointed. The preproduction runs include runs that are stopped at different points of the nitridation process including various points in time that are prior to complete nitridation (saturation). Plasma emissions are measured during the preproduction runs and in particular the intensity of one or more wavelengths at the time the prereduction run is stopped are noted.

The nitrided oxide layers from the various preproduction runs 82 are then analyzed to determine the extent of surface nitridation at the time each preproduction run was stopped (step 84). The results from the analysis of step 84 are then used to determine a model that correlates percent nitridation with relative intensity change (step 86). This can be done by correlating the intensity of one or more plasma emissions measured from the point at which the nitridation process was stopped for each preproduction run to the percent nitridation of the run determined in step 84. Generally the model will rely on one or more wavelengths that show good tracking (variation) with respect to percent nitridation. The model may be, for example, a formula, a table or some other data structure as would be understood by a person of skill in the art and may be stored in memory 31 for future reference during an actual production run of the plasma oxide nitridation process (step 88).

A sufficient number of preproduction runs are performed at various time periods in step 82 in order to provide a sufficient number of samples for analysis in step 84 to allow for an accurate correlation between process length and percent nitridation in step 86. For example, in one embodiment where a 20 Å oxide layer is nitrided using a nitridation process that reaches a steady state condition in approximately 25 seconds, eighteen preproduction runs might be performed, two each for processes stopped every 3 seconds from 6 seconds to 30 seconds. Each of these eighteen wafers are subject to the lab analysis in step 84 and used to create the model for step 86. In other embodiments more or less data points may be collected, analyzed and used in the generation of the model for step 86.

Generally, lab analysis 84 uses sophisticated, albeit expensive and time consuming, techniques not suitable for real-time use during a process to determine the percent nitridation of the oxide layer. In one embodiment, lab analysis 84 includes performing secondary ion mass spectrometry (SIMS) measurements to determine the percent of nitridation undergone by the oxide layer as would be understood by a person of ordinary skill in the art.

After the model for step 86 is created, the plasma oxide nitridation process can be used to endpoint actual production runs 90 in order to stop the production nitridation process at a desired nitridation level. A production run 90 includes initiating a plasma oxide nitridation process within the substrate processing chamber (step 92) and continuously monitoring emissions from the plasma (step 94) using the spectrometer 22 or other radiation collector. The monitored emissions are compared to the model (step 96), and if the monitored emissions indicate the desired nitridation level has been reached (step 98), the process is stopped (step 99). If the monitored emissions do not indicate the desired nitridation level has been reached, the process returns to step 94. In this manner the nitridation process can be endpointed under the control of computer processor 32.

Figure 8A:
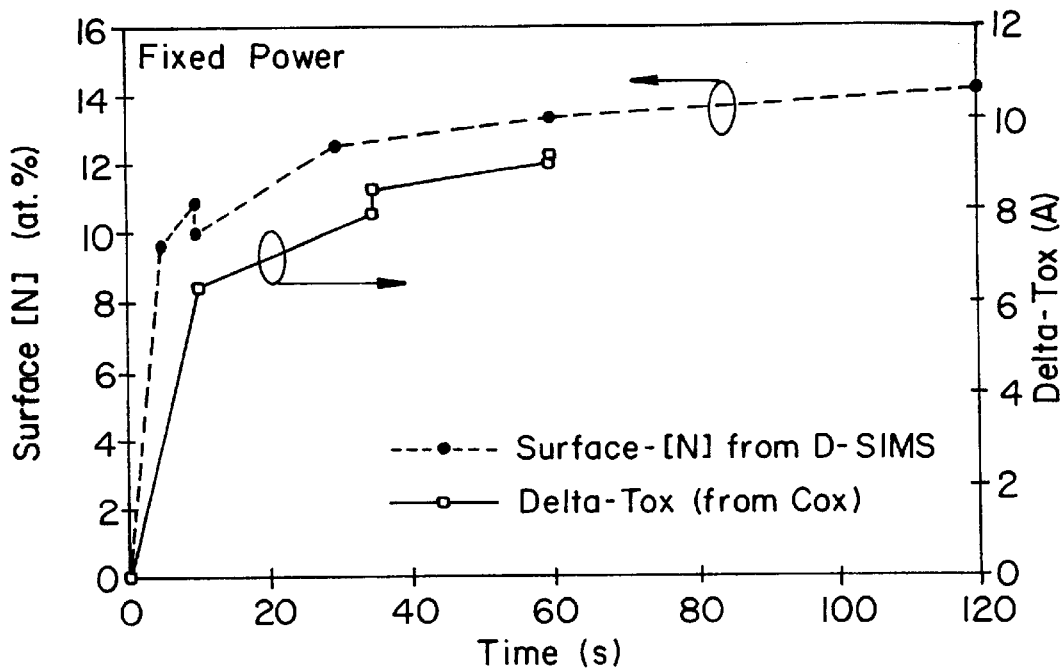
FIG. 8A is a graph showing percent nitridation as a function of time for a plasma oxide nitridation process described in a previously published journal article.
Figure 8B:
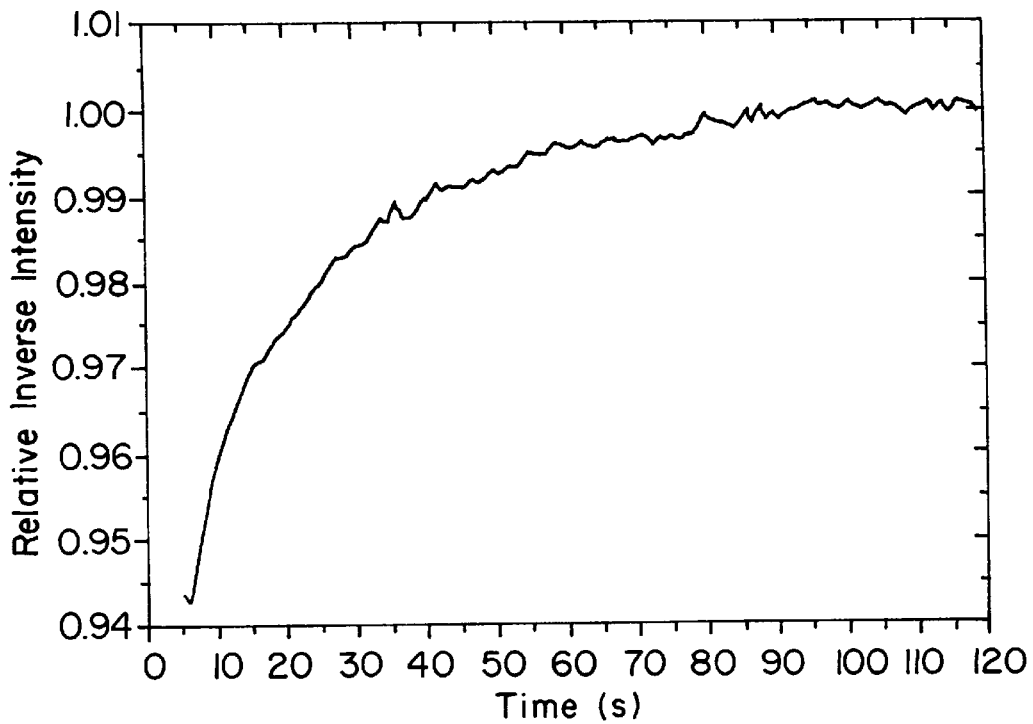
FIG. 8B is a graph showing relative inverse intensity of a 660 nm plasma emission as a function of time for a plasma oxide nitridation process as detected and determined according to one embodiment of the present invention.

Reference is made to FIGS. 8A and 8B to better illustrate calibration process 80 and endpointed production process 90. FIG. 8A is a graph showing atomic percent surface nitridation as a function of time—an example of the type of data that can be collected in steps 82 and 84. The data for this particular FIG. 8A was measured by SIMS analysis for a silicon oxide nitridation process performed for research related to work published in S. V. Hattangady et al., "Remote Plasma Nitrided Oxides for Ultrathin Gate Dielectric Applications," SPIE 1998 Symp. Microelec. Manf., Santa Clara, Calif. FIG. 8B, on the other hand, is the relative inverse intensity at 660 nm for a nitridation process on a 50 Å thick oxide film. In FIG. 8B, the OES data was normalized to total emissions for all spectra then the relative inverse intensity change for the 660 nm normalized line was plotted versus time. The self limiting nature of the nitridation process can be clearly observed from FIG. 8B as the intensity of the normalized spectra reaches 1.00.

Note the data for FIG. 8B is not from the same process run as the data for FIG. 8A. As can be seen in FIG. 8B, however, the relative inverse of the intensity plotted on the y-axis matches closely to the atomic percent nitridation plotted on the y-axis in FIG. 8A. Thus, given data measurements for percent nitridation and normalized intensity for the same nitridation process, a direct correlation can be developed between percent nitridation and relative inverse intensity that can then be used to endpoint future nitridation processes. Such a correlation can then be used to endpoint the nitridation process. For example, if it was desired to stop a production nitridation process when the process reached 10% atomic surface nitridation and the correlation between intensity and percent nitridation resulted in a relative inverse intensity measurement of 0.95% meaning an atomic percent nitridation of 10%, once the emissions measured in step 94 equaled 0.95% when normalized to the relative inverse, step 98 would determine the endpoint of the process had been reached and step 99 would stop the process.

Figure 5B:
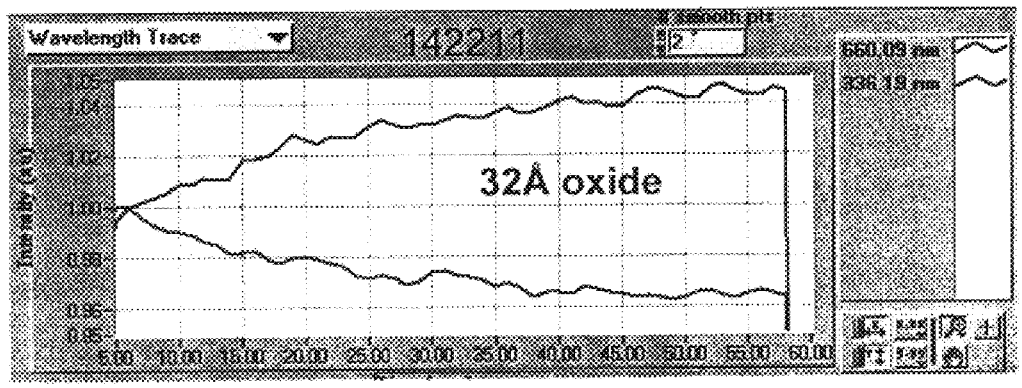
FIGS. 5B and 5C are graphs showing the change in intensity of 336 nm and 660 nm plasma emissions during plasma nitridation processes performed on 32 Å and 24 Å thick silicon oxide layers, respectively.
Figure 5C:
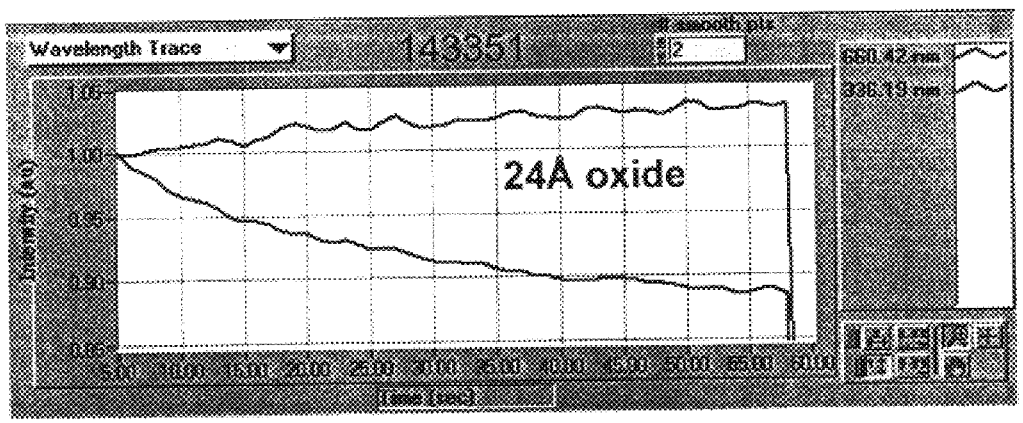

Other embodiments of the invention can endpoint a nitridation process using other techniques. For example, in another embodiment, where it is desirable that the production nitridation process reaches a saturation point, a single wavelength such as 660 nm can be measured during the process. Then, when it is detected that the wavelength, when normalized, reaches a steady state (e.g., less than a 1% variation), the process can be stopped. As an example, FIG. 5B shows that the normalized intensity of the 660 nm plasma emission reaches such a steady state at about 40 seconds.

In still another embodiment, pattern recognition techniques can be used such as those described in U.S. application Ser. No. 09/348,972, filed Jul. 7, 1999, and having Moshe Sarfaty, Lalitha Balasubramhanya and Dimitris Lymberopoulos listed as coinventors. The Ser. No. 09/348,972 application is hereby incorporated by reference for all purposes.

Figure 9:
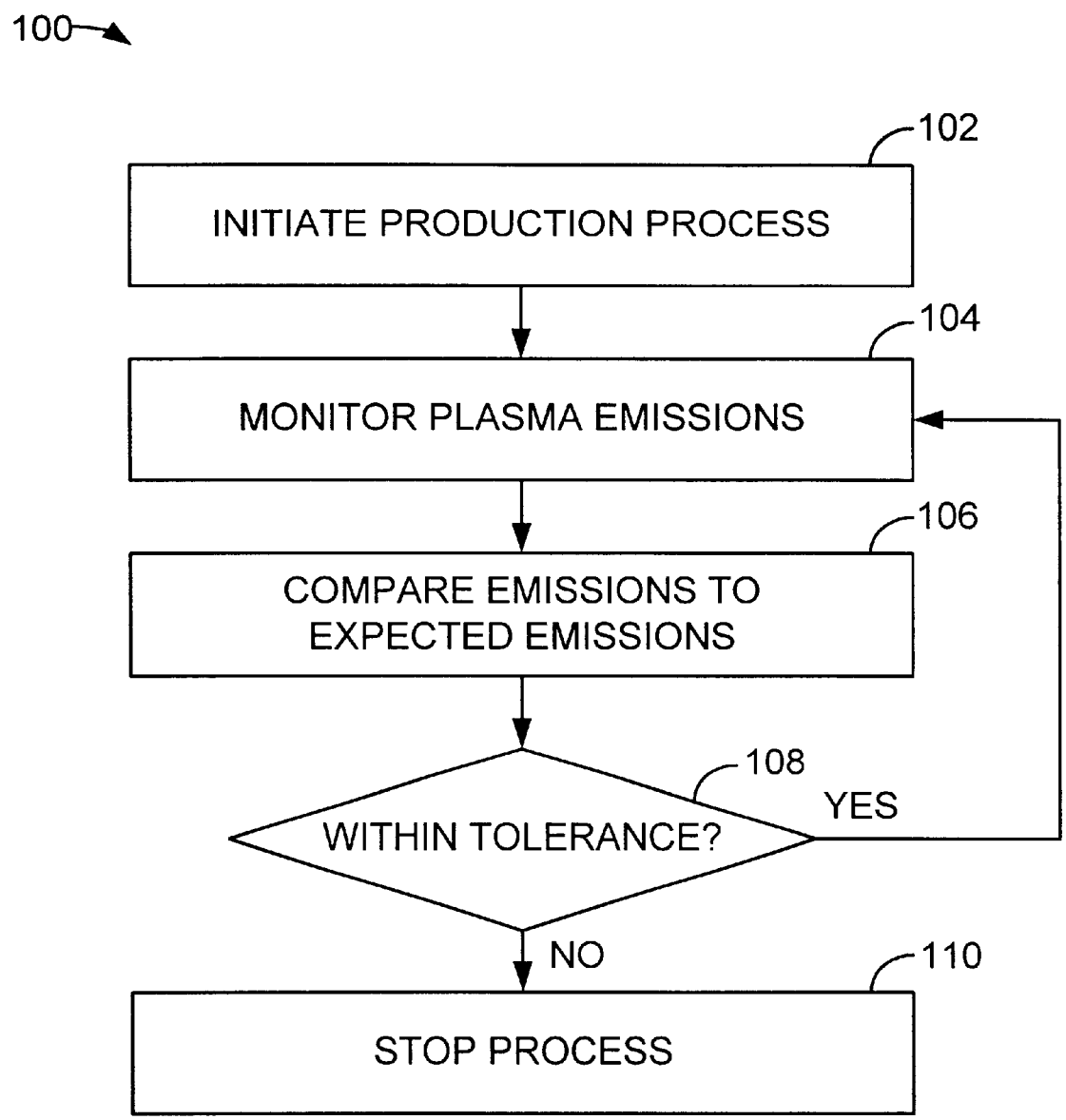
FIG. 9 is a flowchart illustrating one embodiment of the method of the present invention used for fault detection and process health monitoring of a silicon oxide plasma nitridation process.

FIG. 9 is a flowchart illustrating another embodiment of the present invention used to monitor a plasma oxide nitridation process and provide for functionality such as fault detection. As shown in FIG. 9, fault detection method 100 includes initiating a production run of the nitridation process (step 102). Plasma emissions are then measured during the nitridation process (step 104) and compared to emissions that would be expected for such a process at the time period of the comparison (step 106). Such a comparison requires calibration data to be collected from preproduction runs. If the comparison from step 106 indicates that the measured emissions are within a predetermined tolerance level of the expected emissions the process continues (step 108). If the comparison indicates the measured emissions are outside of the tolerance range, however, the process parameters have somehow drifted outside of an acceptable range and a fault may be signaled that causes controller 32 to stop the nitridation process (step 110) so appropriate action can be taken to correct the condition before subsequent process runs also result in such fault conditions.

Having fully described several embodiments of the present invention, other equivalent or alternative methods of controlling a plasma nitridation process according to the present invention will be apparent to those skilled in the art. For example, the methods described with respect to FIGS. 7 and 9 can be used in conjunction with each other to both endpoint a nitridation process and detect fault conditions. These equivalents and alternatives along with the understood obvious changes and modifications are intended to be included within the scope of the present invention.

What is claimed is:

1. A method for nitriding a silicon oxide film formed over a substrate disposed in a substrate processing chamber, said method comprising:

providing a substrate having an exposed silicon oxide film on an upper face thereof;

flowing a gas comprising nitrogen into the chamber;

forming a plasma from said gas and exposing said silicon oxide film to said plasma so as to nitridate said oxide film;

measuring an optical emission of the plasma while said silicon oxide film is being nitridized by exposure to said plasma so as to obtain OES data; and using said OES data to monitor said nitriding process.

2. The method of claim 1 wherein said OES data is used to endpoint said nitriding process.

3. The method of claim 2 wherein using said OES data to endpoint said nitride process comprises comparing said OES data to OES data measured during a previous nitridation process.

4. The method of claim 2 wherein using said OES data to endpoint said nitride process comprises:

comparing the measured wavelengths with wavelengths measured during a previous substrate processing operation using a pattern recognition technique.

5. The method of claim 1 wherein said silicon oxide film is an undoped silicon glass film.

6. The method of claim 1 wherein said OES data is used to stop said nitriding process in response to a fault detection.

7. A method for nitriding a silicon oxide film formed over a substrate disposed in a substrate processing chamber, said method comprising:

flowing a gas comprising nitrogen into the chamber;

forming a plasma from said gas and exposing said silicon oxide film to said plasma;

measuring an optical emission of the plasma while said silicon oxide film is exposed to said plasma to obtain OES data;

normalizing said OES data to previously measured OES data; and using said normalized OES data to endpoint said nitriding process.

8. The method of claim 7 wherein using said normalized OES data to endpoint said nitride process comprises comparing said normalized OES data to normalized OES data measured during one or more previous nitridation processes.

9. The method of claim 8 wherein said OES data from said one or more previous nitridation processes has been correlated to atomic percent nitridation.

10. The method of claim 7 wherein said silicon oxide film is an undoped silicon glass film.

11. A method of fabricating an integrated circuit on a silicon substrate having an upper surface, said method comprising:

forming source and drain regions under said upper surface;

forming a gate oxide over said upper surface;

nitriding said gate oxide by exposing said gate oxide to a nitrogen-containing plasma, wherein said nitriding is endpointed in response to a detection of optical emissions from said plasma.

12. The method of claim 11 further comprising, after said nitriding step, forming a gate over said gate oxide.

13. The method of claim 12 wherein said gate oxide is less than or equal to 30 Å thick.

14. The method of claim 13 wherein said nitriding is endpointed by comparing OES data measured from said plasma to OES data measured during a previous nitridation process.

15. The method of claim 13 wherein said nitriding is endpointed by comparing said optical emissions with optical emissions measured during a previous nitridation process using a pattern recognition technique.

* * * * *